US012612692B2

(12) United States Patent
Ahn et al.

(10) Patent No.: US 12,612,692 B2
(45) Date of Patent: Apr. 28, 2026

(54) MASK ASSEMBLY MANUFACTURING APPARATUS AND MASK ASSEMBLY MANUFACTURING METHOD USING THE SAME

(71) Applicant: Samsung Display Co., Ltd., Yongin-si (KR)

(72) Inventors: Junghyun Ahn, Yongin-si (KR); Jaesuk Moon, Yongin-si (KR); Seungjin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 35 days.

(21) Appl. No.: 18/096,300

(22) Filed: Jan. 12, 2023

(65) Prior Publication Data

US 2023/0323527 A1 Oct. 12, 2023

(30) Foreign Application Priority Data

Apr. 6, 2022 (KR) ........................ 10-2022-0042869

(51) Int. Cl.
| | |
|---|---|
| *C23C 16/04* | (2006.01) |
| *C23C 14/04* | (2006.01) |
| *H10K 71/16* | (2023.01) |

(52) U.S. Cl.
CPC .......... *C23C 16/042* (2013.01); *C23C 14/042* (2013.01); *H10K 71/166* (2023.02)

(58) Field of Classification Search
CPC .. G03F 1/20–22; C23C 16/042; C23C 14/042
See application file for complete search history.

(56) References Cited

U.S. PATENT DOCUMENTS

| | | | |
|---|---|---|---|
| 9,346,078 | B2 | 5/2016 | Oh et al. |
| 9,376,743 | B2 | 6/2016 | Lee |
| 9,525,099 | B2 | 12/2016 | Bluck et al. |

(Continued)

FOREIGN PATENT DOCUMENTS

| | | |
|---|---|---|
| CN | 104685095 A | 6/2015 |
| JP | 2019031720 A | 2/2019 |

(Continued)

*Primary Examiner* — Dah-Wei D. Yuan
*Assistant Examiner* — Stephen A Kitt
(74) *Attorney, Agent, or Firm* — CANTOR COLBURN LLP

(57) ABSTRACT

A mask assembly manufacturing apparatus for manufacturing a mask assembly, including a frame through which an opening is defined and a support bar disposed above the frame, includes a stage on which the frame is placed, an alignment unit disposed above the stage and including magnetic units, and a fixing unit disposed between the stage and the alignment unit and including a first sub-fixing unit which fixes one end of the support bar and a second sub-fixing unit which fixes another end of the support bar and spaced apart from the first sub-fixing unit in a first direction. The magnetic units includes first magnetic units disposed above the support bar and second magnetic units disposed above the support bar, spaced apart from the first magnetic units in a second direction perpendicular to the first direction, and having a polarity opposite to a polarity of the first magnetic units.

10 Claims, 18 Drawing Sheets

(56) References Cited

U.S. PATENT DOCUMENTS

| 2006/0148114 | A1* | 7/2006 | Yotsuya | ............. | H01L 21/6831 |
| | | | | | 257/E21.232 |
| 2011/0239941 | A1 | 10/2011 | Nakagawa et al. | | |
| 2017/0222145 | A1* | 8/2017 | Kim | ........................ | H10K 71/00 |
| 2023/0068722 | A1* | 3/2023 | Moon | ................ | B23K 37/0443 |

FOREIGN PATENT DOCUMENTS

| KR | 1020110112220 | A | 10/2011 |
| KR | 101134361 | B1 | 4/2012 |
| KR | 1020140038592 | A | 3/2014 |
| KR | 1020170091243 | A | 8/2017 |
| KR | 101844643 | B1 | 4/2018 |
| KR | 102002494 | B1 | 7/2019 |
| KR | 102068222 | B1 | 1/2020 |
| KR | 1020200073123 | A | 6/2020 |
| KR | 1020210145897 | A | 12/2021 |

* cited by examiner

FIG. 6
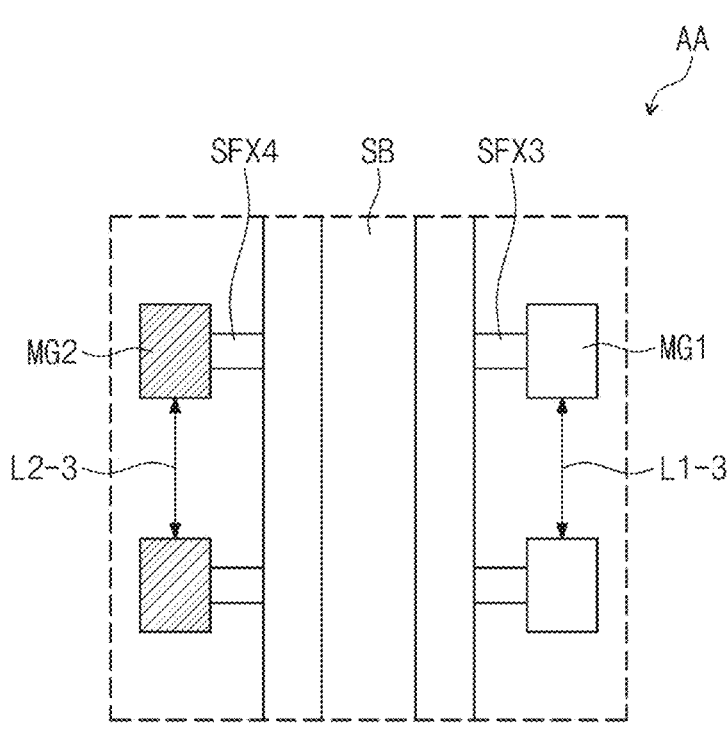
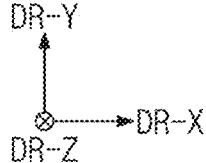

FIG. 7

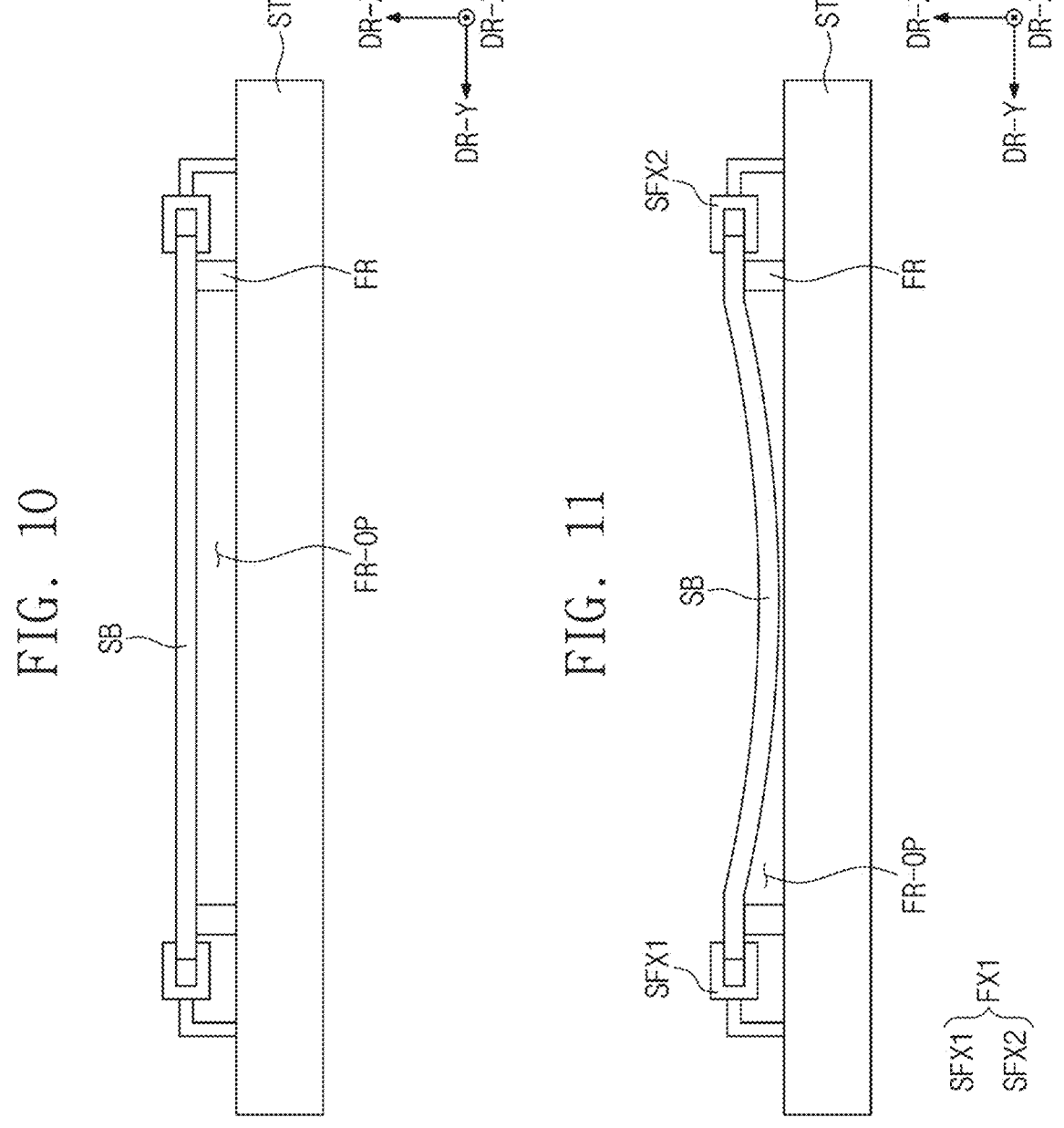

FIG. 12

MASK ASSEMBLY MANUFACTURING APPARATUS AND MASK ASSEMBLY MANUFACTURING METHOD USING THE SAME

This application claims priority to Korean Patent Application No. 10-2022-0042869, filed on Apr. 6, 2022, and all the benefits accruing therefrom under 35 U.S.C. § 119, the content of which in its entirety is herein incorporated by reference.

BACKGROUND

1. Field

The disclosure relates to a mask assembly manufacturing apparatus and a mask assembly manufacturing method using the mask assembly manufacturing apparatus. More particularly, the disclosure relates to a mask assembly manufacturing apparatus including a magnetic unit and a mask assembly manufacturing method using the mask assembly manufacturing apparatus.

2. Description of the Related Art

Multimedia electronic devices, such as televisions, mobile phones, tablet computers, navigation devices, and game devices, include a display panel for displaying an image. The display panel includes pixels displaying the image, and each of the pixels includes a light emitting element for generating a light and a driving element connected to the light emitting element. The display panel may be formed by stacking various functional layers on a substrate.

SUMMARY

When manufacturing a display panel, functional layers of the display panel may be formed through a patterning process using a mask that is provided with an opening area defined therethrough. In this case, a manufacturing method of a mask assembly that is processed with high precision and a technology for the mask assembly manufacturing apparatus are desired to improve a deposition quality of the patterned functional layers.

Embodiments of the disclosure provide a mask assembly manufacturing apparatus to manufacture a mask assembly with improved reliability.

Embodiments of the disclosure provide a mask assembly manufacturing method to manufacture the mask assembly with improved reliability.

Embodiments of the invention provide a mask assembly manufacturing apparatus for manufacturing a mask assembly including a frame through which an opening is defined and a support bar disposed above the frame. In such embodiments, the mask assembly manufacturing apparatus includes a stage on which the frame is placed, an alignment unit disposed above the stage, where the alignment unit includes a plurality of magnetic units, and a fixing unit disposed between the stage and the alignment unit, where the fixing unit includes a first sub-fixing unit which fixes one end of the support bar and a second sub-fixing unit which fixes another end of the support bar and spaced apart from the first sub-fixing unit in a first direction. In such embodiments, the magnetic units include a plurality of first magnetic units disposed above the support bar and a plurality of second magnetic units disposed above the support bar, spaced apart from the first magnetic units in a second direction perpendicular to the first direction, and having a polarity opposite to a polarity of the first magnetic units.

In an embodiment, each of the first magnetic units and the second magnetic units may be disposed spaced apart from the support bar.

In an embodiment, the mask assembly manufacturing apparatus may further include an auxiliary substrate disposed between the alignment unit and the support bar.

In an embodiment, the auxiliary substrate may be disposed directly on the support bar, and the magnetic units may be disposed directly on the auxiliary substrate.

In an embodiment, the auxiliary substrate may be a glass substrate or an acrylic substrate.

In an embodiment, the first magnetic units may be spaced apart from each other at a first distance in the first direction, the second magnetic units may be spaced apart from each other at a second distance in the first direction, and the first distance between the first magnetic units may be equal to the second distance between the second magnetic units.

In an embodiment, a separation distance between a center of the support bar and each of the first magnetic units may be equal to a separation distance between the center of the support bar and each of the second magnetic units disposed to respectively correspond to the first magnetic units.

In an embodiment, the first magnetic units adjacent to each other may be disposed in contact with each other, and the second magnetic units adjacent to each other may be disposed in contact with each other.

In an embodiment, the support bar includes stainless steel (SUS) or a nickle-iron alloy.

In an embodiment, the alignment unit may move a center of the support bar in a direction toward the second magnetic units when the center of the support bar is closer to the first magnetic units than the second magnetic units, and the alignment unit may move the center of the support bar in a direction toward the first magnetic units when the center of the support bar is closer to the second magnetic units than the first magnetic units.

Embodiments of the invention provide a method of manufacturing a mask assembly using a mask assembly manufacturing apparatus including a stage, an alignment unit disposed above the stage and including magnetic units, and a fixing unit disposed between the stage and the alignment unit and including a first sub-fixing unit and a second sub-fixing unit spaced apart from the first sub-fixing unit in a first direction. In such embodiments, the magnetic units include first magnetic units and second magnetic units spaced apart from the first magnetic units in a second direction perpendicular to the first direction and having a polarity opposite to a polarity of the first magnetic units. In such embodiments, the method includes providing a frame through which an opening is defined above the stage, fixing a support bar on the frame using the fixing unit, placing the alignment unit above the support bar, and aligning the support bar using the magnetic units.

In an embodiment, the placing the alignment unit may include placing the first magnetic units to be spaced apart from each other in the first direction and placing the second magnetic units to be spaced apart from each other in the first direction.

In an embodiment, the placing the alignment unit may include placing the first and second magnetic units to allow a separation distance in the first direction between the first magnetic units to be equal to a separation distance in the first direction between the second magnetic units.

In an embodiment, the placing the alignment unit above the support bar may include placing the first and second magnetic units to be spaced apart from the support bar above the support bar.

In an embodiment, the placing the alignment unit above the support bar may include disposing the alignment unit to allow a separation distance between a center of the support bar and each of the first magnetic units to be equal to a separation distance between the center of the support bar and each of the second magnetic units, which are disposed to respectively correspond to the first magnetic units.

In an embodiment, the aligning the support bar may include moving a center of the support bar in a direction toward the second magnetic units when the center of the support bar is closer to the first magnetic units than the second magnetic units and moving the center of the support bar in a direction toward the first magnetic units when the center of the support bar is closer to the second magnetic units than the first magnetic units.

In an embodiment, the method may further include placing an auxiliary substrate above the support bar after the fixing of the support bar above the frame using the fixing unit and before the placing the alignment unit above the support bar, and the placing the alignment unit above the support bar may include placing the first magnetic units and the second magnetic units above the auxiliary substrate.

In an embodiment, the placing the auxiliary substrate above the support bar may include placing the auxiliary substrate directly on the support bar, and the placing the alignment unit above the auxiliary substrate may include placing the first and second magnetic units directly on the auxiliary substrate.

In an embodiment, the placing the alignment unit above the support bar may include placing the first magnetic units arranged in the first direction to be in contact with each other and placing the second magnetic units arranged in the first direction to be in contact with each other.

In an embodiment, the method may further include aligning an additional support bar after the aligning the support bar using the first and second magnetic units. In such an embodiment, the aligning the additional support bar includes moving the fixing unit and the alignment unit in the second direction, fixing the additional support bar on the frame using the fixing unit, placing the alignment unit above the additional support bar, and aligning the additional support bar using the magnetic units.

According to the embodiments, as described above, the mask assembly manufacturing apparatus includes the magnetic units disposed above the support bar, and thus, the support bar disposed above the frame is aligned without being bent.

According to the embodiments, as described above, the mask assembly manufacturing method includes the aligning the support bar using the magnetic units disposed above the support bar, and thus, the mask assembly may be manufactured with improved reliability.

BRIEF DESCRIPTION OF THE DRAWINGS

The above and other features of the embodiments of the disclosure will become readily apparent by reference to the following detailed description when considered in conjunction with the accompanying drawings, in which:

Figure 1A:
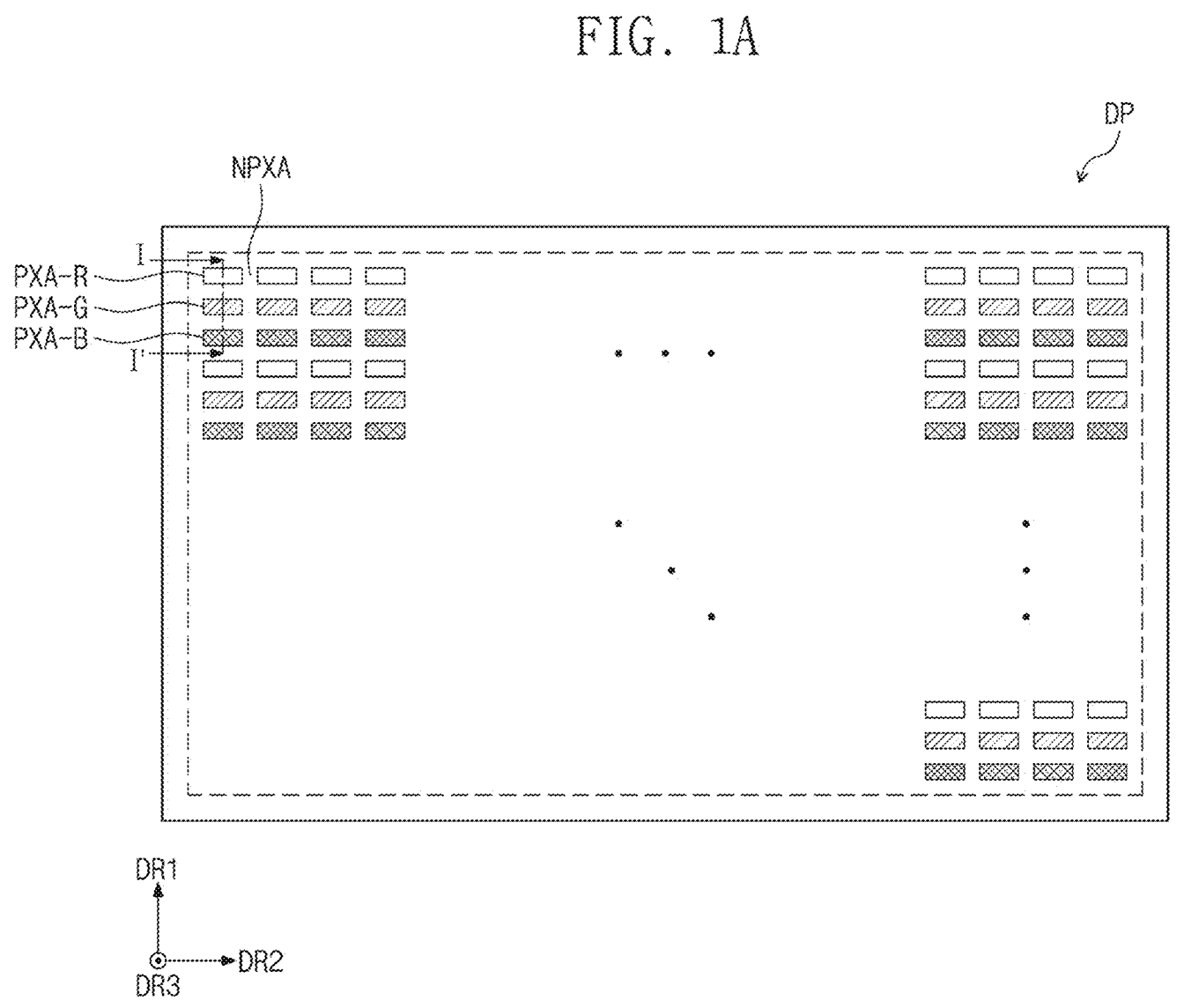

FIG. 1A is a plan view of a display panel according to an embodiment of the disclosure;

FIG. 5 is a front view of a mask assembly manufacturing apparatus according to an embodiment of the disclosure;

FIG. 6 is a view of a portion of a mask assembly manufacturing apparatus according to an embodiment of the disclosure;

FIG. 7 is a front view of a portion of a mask assembly manufacturing apparatus according to an embodiment of the disclosure;

FIG. 10 is a view of a process of a mask assembly manufacturing method according to an embodiment of the disclosure;

FIG. 11 is a view of a process of a mask assembly manufacturing method according to an embodiment of the disclosure;

FIG. 12 is a view of a process of a mask assembly manufacturing method according to an embodiment of the disclosure;

DETAILED DESCRIPTION

Figure 1B:
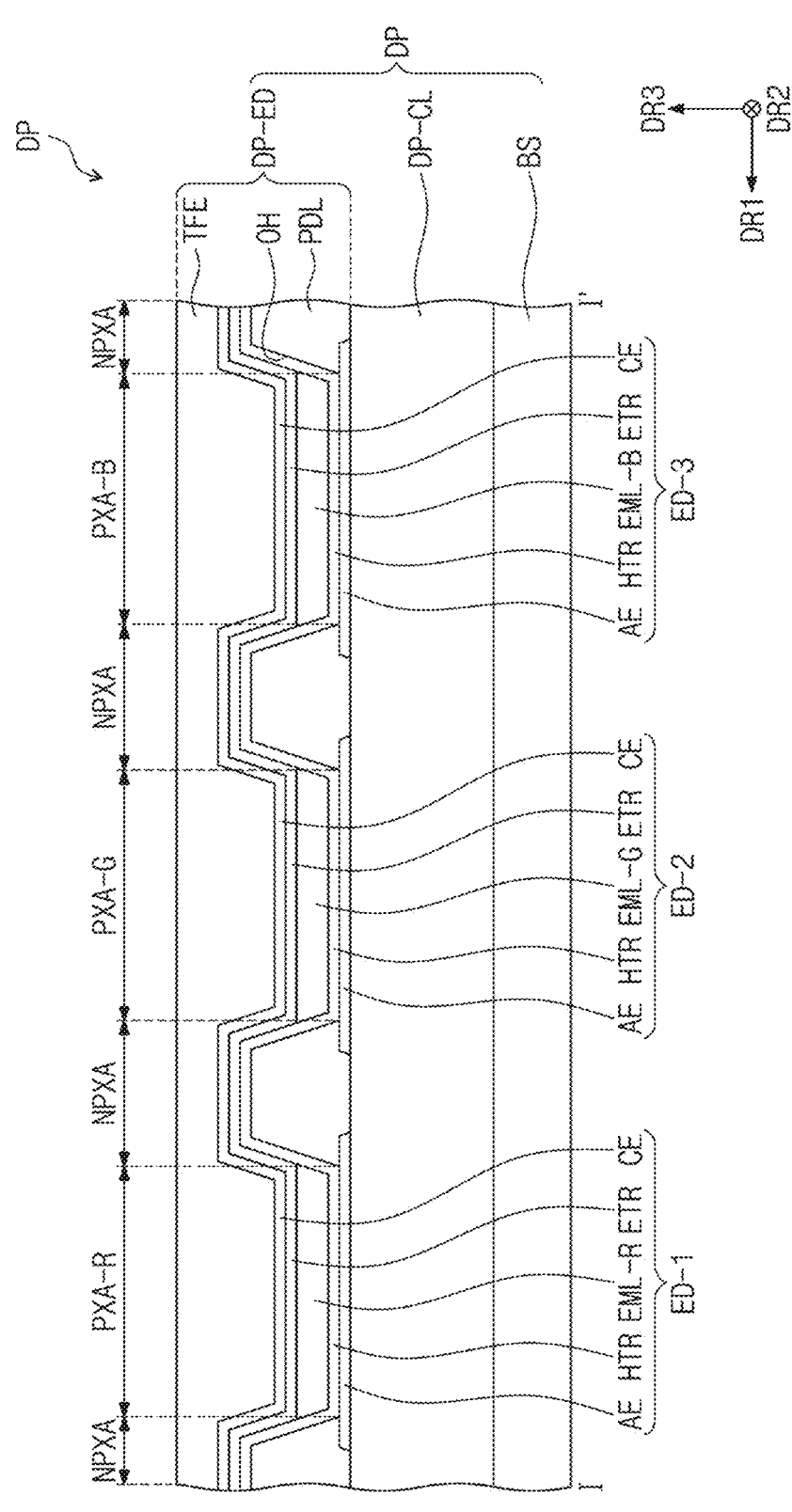
FIG. 1B is a cross-sectional view taken along line I-I' of FIG. 1A showing the display panel according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the disclosure, it will be understood that when an element (or area, layer, or portion) is referred to as being "on", "connected to" or "coupled to" another element or layer, it can be directly on, connected or coupled to the other element or layer or intervening elements or layers may be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of a mask assembly manufacturing apparatus and a mask assembly manufacturing method will be described in detail with reference to accompanying drawings.

FIG. 1A is a plan view of a display panel DP according to an embodiment of the disclosure, and FIG. 1B is a cross-sectional view taken along line I-I' of FIG. 1A showing the display panel DP according to an embodiment of the disclosure.

An embodiment of the display panel DP may be activated in response to electrical signals and may display an image. The display panel DP may be applied to various display devices. In an embodiment, for example, the display panel DP may be applied to a large-sized electronic device, such as a television set, an outdoor billboard, etc., and a small and medium-sized electronic device, such as a monitor, a mobile phone, a tablet computer, a navigation unit, a game unit, etc.

The display panel DP according to an embodiment may be a light-emitting type display panel, however, it should not be particularly limited. In an embodiment, for example, the display panel DP may be an organic light emitting display panel, an inorganic light emitting display panel, or a quantum dot light emitting display panel. A light emitting layer of the organic light emitting display panel may include an organic light emitting material. A light emitting layer of the inorganic light emitting display panel may include an inorganic light emitting material. A light emitting layer of the quantum dot light emitting display panel may include a quantum dot or a quantum rod. Hereinafter, for convenience of description, embodiments where the display panel DP is the organic light emitting display panel will be described in detail.

FIG. 1A is a plan view schematically showing the display panel DP when viewed in a third directional axis DR3. Referring to FIG. 1A, the display panel DP may include a plurality of light emitting areas PXA-R, PXA-G, and PXA-B and a non-light-emitting area NPXA surrounding the light emitting areas PXA-R, PXA-G, and PXA-B.

In the disclosure, a direction crossing a plane defined by a first directional axis DR1 and a second directional axis DR2 may be defined as the third directional axis DR3. The third directional axis DR3 may be substantially perpendicular to the plane defined by the first directional axis DR1 and the second directional axis DR2.

Front (or upper) and rear (or lower) surfaces of each member or each unit of the display panel DP may be defined with respect to a plane substantially parallel to each of the first and second directional axes DR1 and DR2. The front and rear surfaces may be opposite to each other in the third directional axis DR3, and a normal line direction of each of the front and rear surfaces may be substantially parallel to the third directional axis DR3.

In the disclosure, a separation distance between the front and rear surfaces of each member (or each unit) in the third directional axis DR3 may correspond to a thickness of the member (or the unit) in the third directional axis DR3. In the descriptions with reference to FIGS. 1A to 2, the expression "when viewed in a plane" or when viewed in a plan view" may mean a state of being viewed in the third directional axis DR3. In the descriptions with reference to FIGS. 1A to 2, the expression "when viewed in a cross-section" may mean a state of being viewed in the first directional axis DR1 or the second directional axis DR2. However, directions indicated by the first, second, and third directional axes DR1, DR2, and DR3 may be relative to each other, and thus, the directions indicated by the first, second, and third directional axes DR1, DR2, and DR3 may be changed to other directions. In addition, the first, second, and third directional axes DR1, DR2, and DR3 may be referred to as first, second, and third directions, respectively, and the first, second, and third directions may be assigned with the same reference numerals as the first, second, and third directional axes DR1, DR2, and DR3.

The light emitting areas PXA-R, PXA-G, and PXA-B may include a first light emitting area PXA-R, a second light emitting area PXA-G, and a third light emitting area PXA-B. The first light emitting area PXA-R, the second light emitting area PXA-G, and the third light emitting area PXA-B may be distinguished from each other on the plane substantially parallel to the first and second directions DR1 and DR2. The non-light-emitting area NPXA may surround the first, second, and third light emitting areas PXA-R, PXA-G, and PXA-B adjacent to each other.

The first light emitting area PXA-R, the second light emitting area PXA-G, and the third light emitting area PXA-B may be distinguished from each other according to colors of lights emitted therethrough. In an embodiment, for example, the first light emitting area PXA-R may be a red light emitting area that emits a red light, the second light emitting area PXA-G may be a green light emitting area that emits a green light, and the third light emitting area PXA-B may be a blue light emitting area that emits a blue light.

FIG. 1A shows an embodiment having a structure in which the first, second, and third light emitting areas PXA-R, PXA-G, and PXA-B are arranged in a stripe form. Each of the first light emitting areas PXA-R, the second light emitting areas PXA-G, and the third light emitting areas PXA-B may be arranged in the second direction DR2. In addition, the first light emitting area PXA-R, the second light emitting area PXA-G, and the third light emitting area PXA-B may be arranged sequentially along the first direction DR1.

However, the arrangement of the first, second, and third light emitting areas PXA-R, PXA-G, and PXA-B should not be limited to the structure shown in FIG. 1A, and the arrangement, size, and shape of the first, second, and third light emitting areas PXA-R, PXA-G, and PXA-B may be designed in various ways according to characteristics of a display quality required for the display panel DP. In an alternative embodiment, for example, the first, second, and third light emitting areas PXA-R, PXA-G, and PXA-B may be arranged in a pentile form (PENTILE) or a diamond form (Dimond Pixel™).

The display panel DP may include at least one functional layer commonly formed over the light emitting areas PXA-R, PXA-G, and PXA-B and the non-light-emitting area NPXA. In an embodiment, the functional layer overlapping the light emitting areas PXA-R, PXA-G, and PXA-B and the non-light-emitting area NPXA may be referred to as a common layer.

In an embodiment, the display panel DP may include at least one functional layer patterned to correspond to each of the light emitting areas PXA-R, PXA-G, and PXA-B. The functional layer patterned and formed in each of the light emitting areas PXA-R, PXA-G, and PXA-B may be referred to as a patterned layer. The patterned layer may be formed using a mask assembly MSA (refer to FIG. 2) described later. The mask assembly MSA (refer to FIG. 2) used to manufacture the display panel DP may be manufactured by a mask assembly manufacturing apparatus and a mask assembly manufacturing method, which are described later.

FIG. 1B shows a cross-section of the display panel DP corresponding to one first light emitting area PXA-R, one second light emitting area PXA-G, and one third light emitting area PXA-B.

Referring to FIG. 1B, an embodiment of the display panel DP may include a base layer BS, a circuit layer DP-CL, and a display element layer DP-ED. The display element layer DP-ED of the display panel DP may include a plurality of light emitting elements ED-1, ED-2, and ED-3.

The base layer BS may provide a base surface on which the circuit layer DP-CL is disposed. The base layer BS may include a glass, synthetic resin, or organic/inorganic composite material. The base layer BS may have a single-layer or multi-layer structure.

The circuit layer DP-CL may include driving elements (not shown) and signal lines (not shown) connected to the light emitting elements ED-1, ED-2, and ED-3. The circuit layer DP-CL may include at least one insulating layer, a semiconductor pattern, and a conductive pattern, which form or define a driving circuit of a pixel.

The display element layer DP-ED may be disposed on the circuit layer DP-CL. The display element layer DP-ED may include the light emitting elements ED-1, ED-2, and ED-3, a pixel definition layer PDL, and an encapsulation layer TFE. Each of the light emitting elements ED-1, ED-2, and ED-3 may include a first electrode AE, a hole transport region HTR, a corresponding light emitting layer among light emitting layers EML-R, EML-G, and EML-B, an electron transport region ETR, and a second electrode CE.

The pixel definition layer PDL may be provided with light emitting openings OH defined therethrough to expose a portion of the first electrodes AE of the light emitting elements ED-1, ED-2, and ED-3. Portions of the first electrodes AE exposed through the light emitting openings OH of the pixel definition layer PDL may correspond to the light emitting areas PXA-R, PXA-G, and PXG-B, respectively. An area in which the pixel definition layer PDL is disposed may correspond to the non-light-emitting area NPXA surrounding the light emitting areas PXA-R, PXA-G, and PXG-B.

In an embodiment, as shown in FIG. 1B, the light emitting layers EML-R, EML-G, and EML-B of the light emitting elements ED-1, ED-2, and ED-3 may be disposed in the light emitting openings OH defined through the pixel definition layer PDL, respectively. The light emitting layers EML-R, EML-G, and EML-B may be provided in the form of a pattern to correspond to the light emitting openings OH, however, they should not be limited thereto or thereby. According to an embodiment, the light emitting layers EML-R, EML-G, and EML-B of the light emitting elements ED-1, ED-2, and ED-3 may be provided or formed integrally with each other as a common layer (or as a single unitary and indivisible part).

Each of the hole transport region HTR, the electron transport region ETR, and the second electrode CE may be provided as a common layer overlapping the light emitting elements ED-1, ED-2, and ED-3. The hole transport region HTR, the electron transport region ETR, and the second electrode CE may be formed to overlap the light emitting areas PXA-R, PXA-G, and PXG-B and the non-light-emitting area NPXA.

The encapsulation layer TFE may be disposed on the light emitting elements ED-1, ED-2, and ED-3. The encapsulation layer TFE may encapsulate the light emitting elements ED-1, ED-2, and ED-3. The encapsulation layer TFE may include a plurality of thin films to improve an optical efficiency of the light emitting elements ED-1, ED-2, and ED-3 or to protect the light emitting elements ED-1, ED-2, and ED-3.

The encapsulation layer TFE may include at least one inorganic layer and an organic layer. The inorganic layer of the encapsulation layer TFE may protect the light emitting elements ED-1, ED-2, and ED-3 from moisture and/or oxygen. In an embodiment, for example, the organic layer may cover particles or flexures existing in the inorganic layer disposed under the organic layer. In addition, the organic layer may relieve a stress between the layers in contact with the organic layer.

At least one layer among layers commonly formed in the pixels of the display panel DP may be deposited and formed using the mask assembly described later. In an embodiment, for example, at least one selected from the hole transport region HTR, the electron transport region ETR, and the second electrode CE in the display panel DP shown in FIG. 1B may be deposited using the mask assembly, however, it should not be limited thereto or thereby. According to an embodiment, the encapsulation layer TFE of the display panel DP may be deposited using the mask assembly. Hereinafter, embodiments of the mask assembly will be described in detail.

Figure 2:
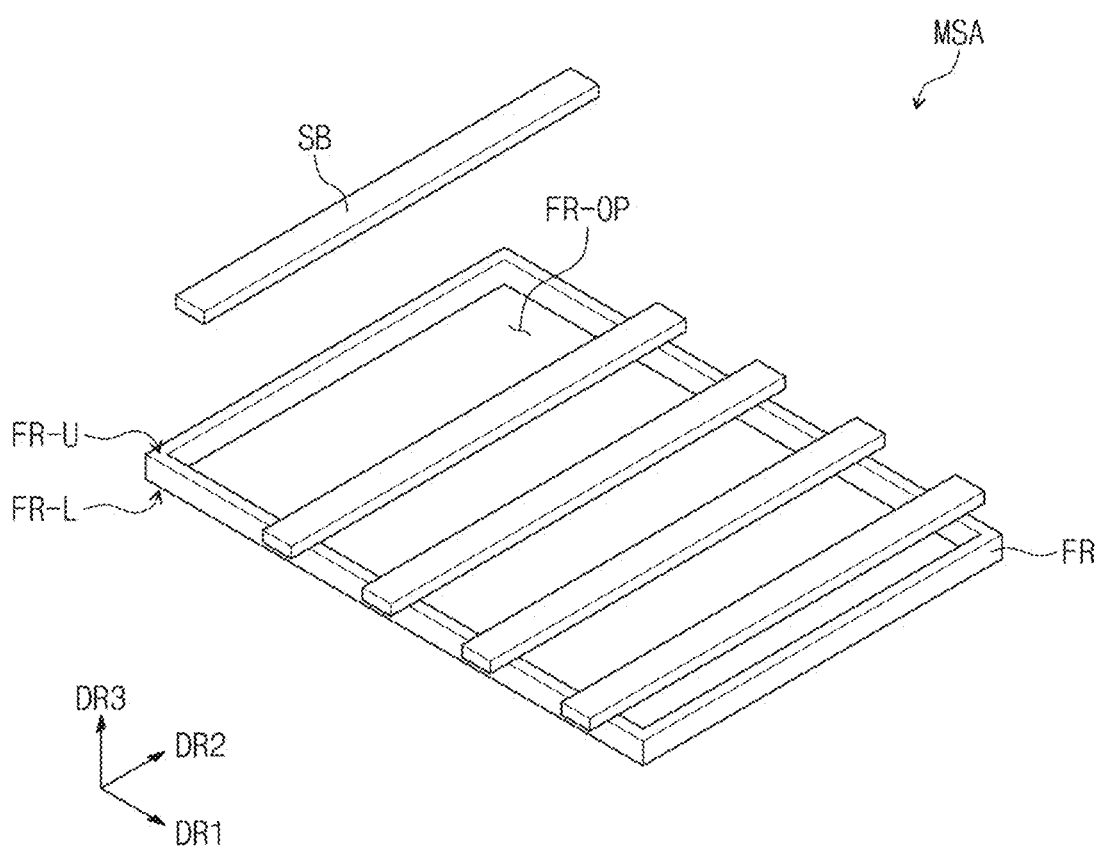
FIG. 2 is an exploded perspective view of a mask assembly according to an embodiment of the disclosure.

FIG. 2 is an exploded perspective view of the mask assembly MSA according to an embodiment of the disclosure. Referring to FIG. 2, an embodiment of the mask assembly MSA may include a support bar SB and a frame FR. The support bar SB may be provided in plural, the support bars SB may be disposed to extend in the second direction DR2, and the support bars SB may be arranged in the first direction DR1.

The frame FR may support the support bar SB. The frame FR may have a ring shape when viewed in the plane. Accordingly, an opening FR-OP may be defined in an inner portion of the frame FR to penetrate an upper surface FR-U and a lower surface FR-L of the frame FR.

FIG. 2 shows an embodiment where the frame FR has a quadrangular ring shape, but the shape of the frame FR should not be limited thereto or thereby. In an alternative embodiment, for example, the frame FR may have one of other various shapes, e.g., a circular ring shape or a polygonal ring shape.

The frame FR may support an edge portion of the support bar SB. The frame FR may be disposed under the support bar SB, however, this is merely an example. The frame FR may be disposed at an upper edge portion or a lower edge portion of the support bar SB or may be disposed at both the upper edge portion and the lower edge portion of the support bar SB to support the support bar SB.

The frame FR may include a metal material. The frame FR may include or be formed of the metal material including at least one selected from iron (Fe) and nickel (Ni). In an embodiment, for example, the frame FR may include an iron-nickel alloy. The frame FR may include stainless steel (SUS) or a nickel-iron alloy (e.g., Invar or 64FeNi).

The support bar SB may be disposed on the frame FR. The support bar SB may include short sides extending in the first direction DR1 and long sides extending in the second direction DR2. The support bars SB may be disposed on the frame FR and may be spaced apart from each other in the first direction DR1.

The support bar SB may include a metal material. The support bar SB may include or be formed of a metal material including at least one selected from iron (Fe) and nickel (Ni). In an embodiment, for example, the support bar SB may include an iron-nickel alloy. The support bar SB may include stainless steel (SUS) or Invar. The support bar SB may include a same material as that of the frame FR, however, the material for the support bar SB should not be limited thereto or thereby.

The mask assembly MSA may be manufactured using the mask assembly manufacturing apparatus MD described later. The mask assembly manufacturing apparatus MD may include magnetic units MG1 and MG2 to prevent the support bar SB disposed on the frame FR from sagging. Hereinafter, an embodiment of the mask assembly manufacturing apparatus MD, which a manufacturing apparatus for manufacturing the mask assembly MSA, and an embodiment of the mask assembly manufacturing method using the mask assembly manufacturing apparatus MD will be described.

Figure 3:
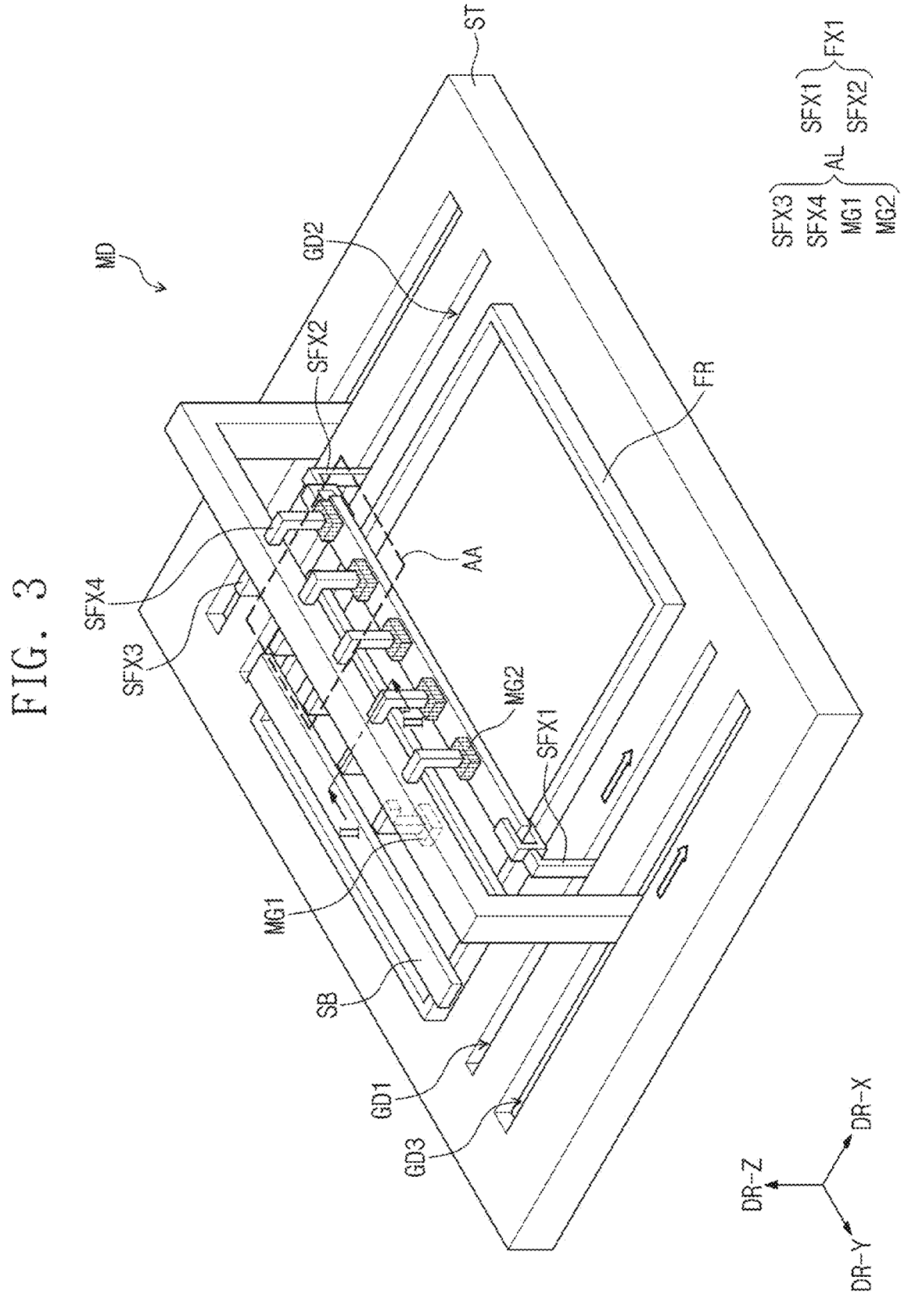
FIG. 3 is a perspective view of a mask assembly manufacturing apparatus according to an embodiment of the disclosure.
Figure 4:
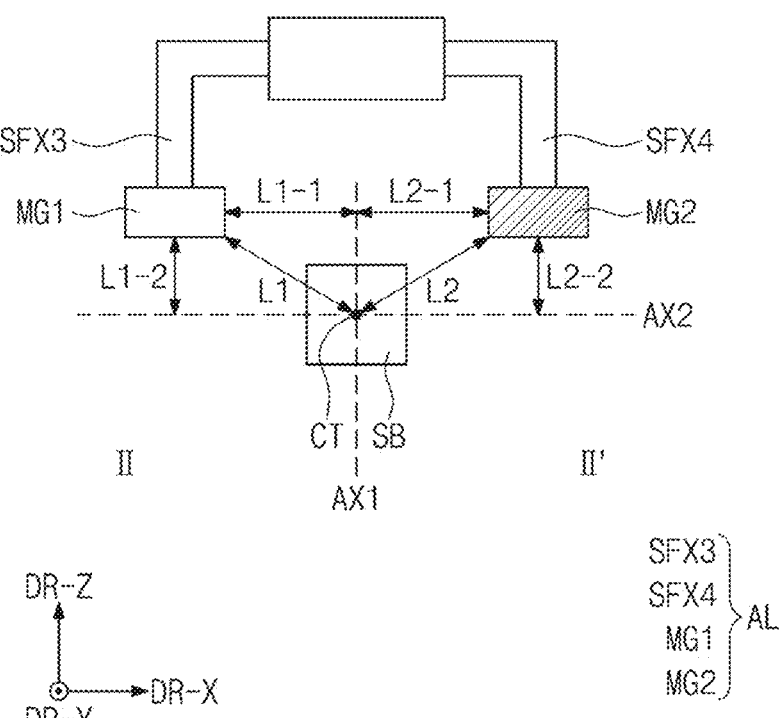
FIG. 4 is a cross-sectional view of a portion of a mask assembly manufacturing apparatus according to an embodiment of the disclosure.
Figure 5:
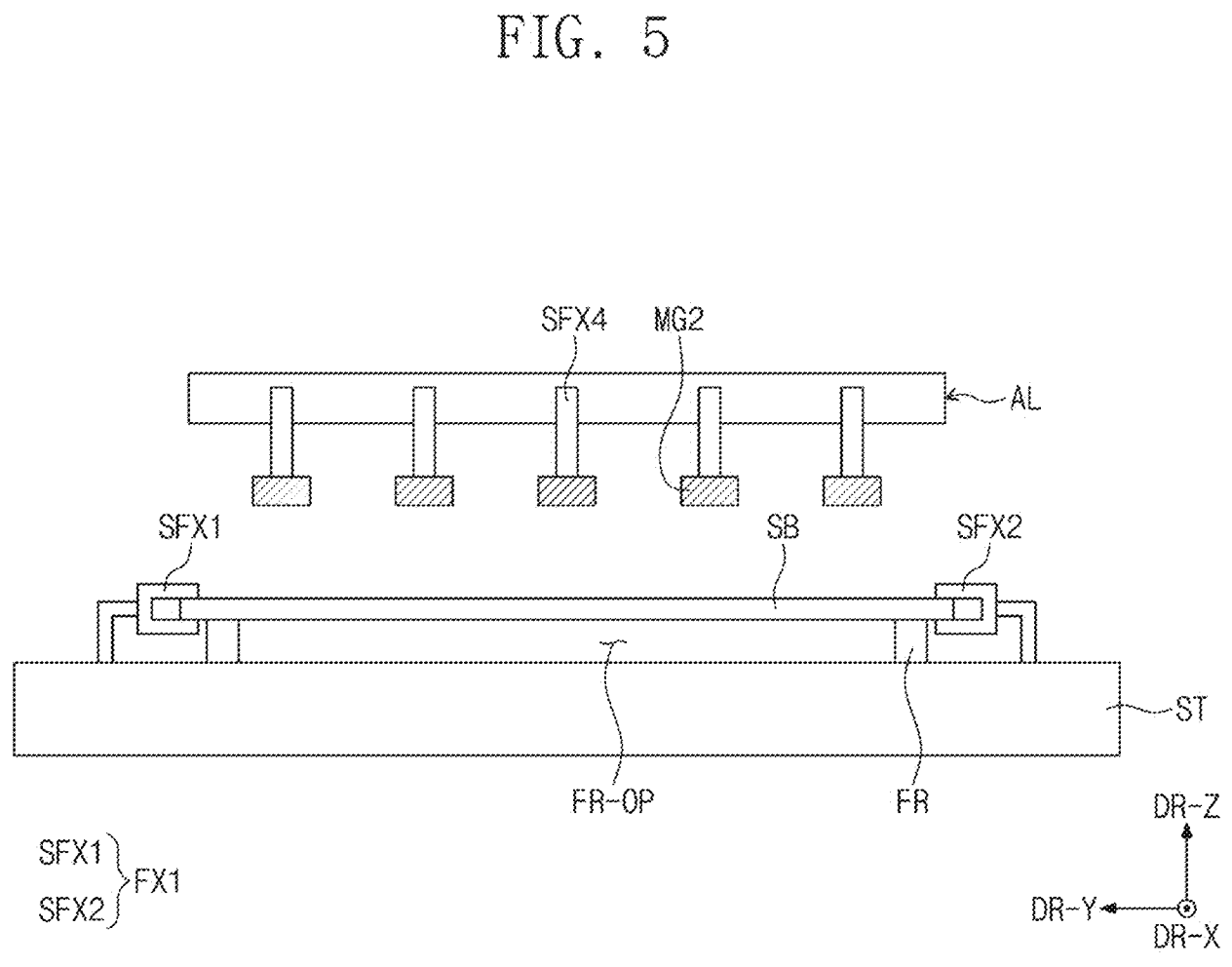

FIG. 3 is a perspective view of the mask assembly manufacturing apparatus MD according to an embodiment of the disclosure. FIG. 4 is a cross-sectional view of a portion of the mask assembly manufacturing apparatus MD according to an embodiment of the disclosure. FIG. 5 is a front view of the mask assembly manufacturing apparatus MD according to an embodiment of the disclosure. FIG. 6 is a view of a portion of the mask assembly manufacturing apparatus MD according to an embodiment of the disclosure.

Referring to FIGS. 3 to 6, an embodiment of the mask assembly manufacturing apparatus MD may include a stage ST, a fixing unit FX1, and an alignment unit AL. The stage ST may be substantially parallel to a plane defined by an X directional axis DR-X and a Y directional axis DR-Y. FIG. 4 is a cross-sectional view taken along line II-IP shown in FIG. 3. FIG. 6 is a plan view of a portion corresponding to an area AA shown in FIG. 3.

In FIGS. 3 to 8, FIGS. 10 to 13B and FIGS. 15 to 16, the X directional axis, the Y directional axis, and a Z directional axis DR-X, DR-Y, and DR-Z are shown. In the disclosure, directions respectively indicated by the X, Y, and Z directional axes DR-X, DR-Y, and DR-Z may be relative to each other and may be changed to other directions. In addition, the directions respectively indicated by the X, Y, and Z directional axes DR-X, DR-Y, and DR-Z may be referred to as X, Y, and Z directions, and the X, Y, and Z directions may be assigned with the same reference numerals. In the disclosure, the X directional axis DR-X may be substantially perpendicular to the Y directional axis DR-Y, and the Z directional axis DR-Z may be a normal line direction with respect to the plane defined by the X directional axis DR-X and the Y directional axis DR-Y. Hereinafter, the Y direction may be referred to as a first direction, and the X direction may be referred to as a second direction.

The fixing unit FX1 may be disposed on the stage ST. The alignment unit AL may be disposed on the fixing unit FX1. The fixing unit FX1 may be disposed spaced apart from the stage ST in the Z direction DR-Z. The alignment unit AL may be disposed spaced apart from the stage ST in the Z direction DR-Z.

The frame FR may be placed on the stage ST. The support bar SB may be fixed to a position by the fixing unit FX1. The support bar SB may be disposed between the stage ST and the alignment unit AL. The support bar SB may be disposed in a position between the frame FR disposed on the stage ST and the alignment unit AL.

The fixing unit FX1 may include a first sub-fixing unit SFX1 and a second sub-fixing unit SFX2 spaced apart from the first sub-fixing unit SFX1 in the Y direction DR-Y. Each of the first sub-fixing unit SFX1 and the second sub-fixing unit SFX2 may be disposed on the stage ST. The first sub-fixing unit SFX1 may move in the X direction DR-X along a first guide GD1. The second sub-fixing unit SFX2 may move in the X direction DR-X along a second guide GD2. Each of the first guide GD1 and the second guide GD2 may be a groove defined in the stage ST.

As the first sub-fixing unit SFX1 and the second sub-fixing unit SFX2 move in the X direction DR-X, a position of the support bar SB on the frame FR may be adjusted in the mask assembly manufacturing apparatus. In an embodiment, for example, the first sub-fixing unit SFX1 and the second sub-fixing unit SFX2 may move along the guides GD1 and GD2, respectively, such that the support bars SB may be sequentially arranged from one side of the frame FR to the other side of the frame FR.

Each of the first sub-fixing unit SFX1 and the second sub-fixing unit SFX2 may be disposed on the frame FR. The first sub-fixing unit SFX1 and the second sub-fixing unit SFX2 may be disposed between the frame FR placed on the stage ST and the alignment unit AL.

The alignment unit AL may include the magnetic units MG1 and MG2. The alignment unit AL may further include third sub-fixing units SFX3 and fourth sub-fixing units SFX4. First magnetic units MG1 may be disposed at one ends of the third sub-fixing units SFX3, respectively, and second magnetic units MG2 may be disposed at one ends of the fourth sub-fixing units SFX4, respectively. The third sub-fixing units SFX3 and the fourth sub-fixing units SFX4 may be disposed above the fixing unit FX1. The third sub-fixing units SFX3 and the fourth sub-fixing units SFX4 may be disposed spaced apart from the fixing unit FX1 in the Z direction DR-Z. The third sub-fixing units SFX3 may be disposed spaced apart from the fourth sub-fixing units SFX4 respectively corresponding to the third sub-fixing units SFX3 in the X direction DR-X.

Referring to FIG. 4, the first magnetic units MG1 and the second magnetic units MG2 may be disposed spaced apart from the support bar SB in a cross-section viewed from the Y direction DR-Y. A separation distance L1-2 in the Z direction DR-Z between the first magnetic unit MG1 and the support bar SB may be the same as a separation distance L2-2 in the Z direction DR-Z between the second magnetic unit MG2 and the support bar SB. The first magnetic unit MG1 and the second magnetic unit MG2 may be disposed spaced apart from the support bar SB in the X direction DR-X in the cross-section viewed from the Y direction DR-Y. A distance L1-1 in the X direction DR-X between the first magnetic unit MG1 and the support bar SB may be the same as a distance L2-1 in the X direction DR-X between the second magnetic unit MG2 and the support bar SB.

The first magnetic unit MG1 and the second magnetic unit MG2 may be disposed spaced apart from the support bar SB in the Z direction DR-Z in the cross-section viewed from the Y direction DR-Y. That is, an empty space may be defined between the first magnetic unit MG1 and the support bar SB and between the second magnetic unit MG2 and the support bar SB, however, this is merely an example. In an embodiment, for example, other components may be disposed between the first magnetic unit MG1 and the support bar SB and between the second magnetic unit MG2 and the support bar SB.

In the cross-section viewed from the Y direction DR-Y or as shown in FIG. 4, a separation distance L1 between the first magnetic unit MG1 and the support bar SB may be the same as a separation distance L2 between the second magnetic unit MG2 and the support bar SB. In addition, in the cross-section viewed from the Y direction DR-Y, the separation distance L1-1 in the X direction DR-X between the first magnetic unit MG1 and the support bar SB may be the same as the separation distance L2-1 in the X direction DR-X between the second magnetic unit MG2 and the support bar SB, and the separation distance L1-2 in the Z direction DR-Z between the first magnetic unit MG1 and the support bar SB may be the same as the separation distance L2-2 in the Z direction DR-Z between the second magnetic unit MG2 and the support bar SB.

In such an embodiment where the separation distance L1 between the support bar SB and the first magnetic unit MG1 is the same as the separation distance L2 between the support bar SB and the second magnetic unit MG2, a magnetic force applied to the support bar SB by the first magnetic unit MG1 may be the same as a magnetic force applied to the support bar SB by the second magnetic unit MG2.

The separation distance L1 between the support bar SB and the first magnetic unit MG1 and the separation distance L2 between the support bar SB and the second magnetic unit MG2 may be defined by a shortest distance between a center CT of the support bar SB and the first magnetic unit MG1 and a shortest distance between the center CT of the support bar SB and the second magnetic unit MG2, respectively.

The separation distance L1-1 in the X direction DR-X between the support bar SB and the first magnetic unit MG1 and the separation distance L2-1 in the X direction DR-X between the support bar SB and the second magnetic unit MG2 may be defined by a minimum distance between an imaginary line AX1 extending from the center CT of the support bar SB along the Z direction DR-Z and the first magnetic unit MG1 and a minimum distance between the imaginary line AX1 and the second magnetic unit MG2, respectively.

The separation distance L1-2 in the Z direction DR-Z between the support bar SB and the first magnetic unit MG1 and the separation distance L2-2 in the Z direction DR-Z between the support bar SB and the second magnetic unit MG2 may be defined by a minimum distance between an imaginary line AX2 extending from the center CT of the support bar SB along the X direction DR-X and the first magnetic unit MG1 and a minimum distance between the imaginary line AX2 and the second magnetic unit MG2.

Referring to FIG. 6, the first magnetic units MG1 may be disposed spaced apart from each other in the Y direction DR-Y. The first magnetic units MG1 may be spaced apart from each other at a first distance L1-3. The second magnetic units MG2 may be disposed spaced apart from each other in the Y direction DR-Y. The second magnetic units MG2 may be spaced apart from each other at a second distance L2-3. The first distance L1-3 between the first magnetic units MG1 may be the same as the second distance L2-3 between the second magnetic units MG2 adjacent to the first magnetic units MG1. The first magnetic units MG1 and the second magnetic units MG2 may correspond to each other in a one-to-one correspondence in the X direction DR-X.

In an embodiment, the first magnetic unit MG1 and the second magnetic unit MG2 may have different polarities from each other. In an embodiment, for example, the first magnetic unit MG1 has an N-pole, and the second magnetic unit MG2 may have an S-pole. Alternatively, the first magnetic unit MG1 has the S-pole, and the second magnetic unit MG2 may have the N-pole.

Figure 7:
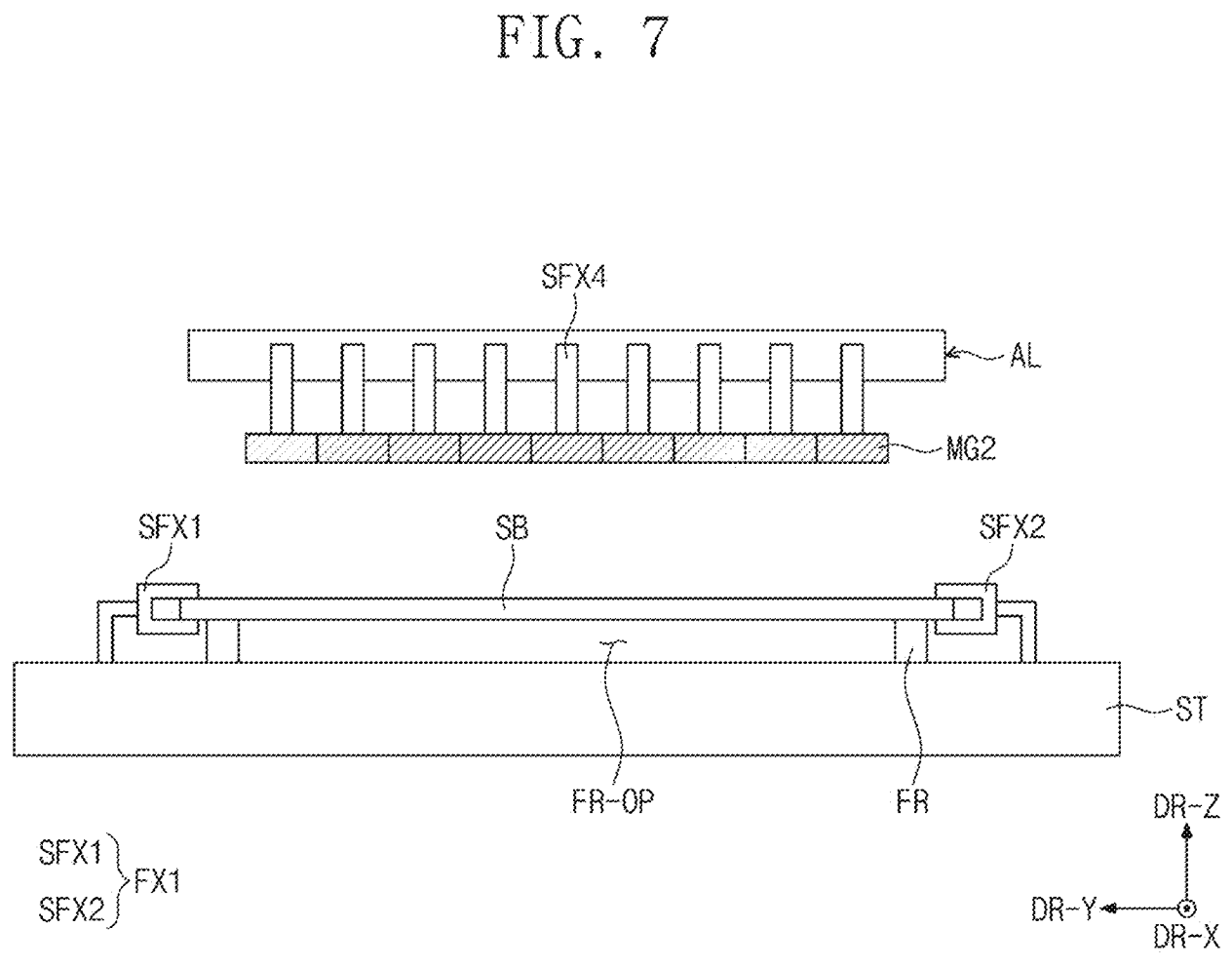

FIGS. 3 to 6 show an embodiment having a structure in which the second magnetic units MG2 are disposed spaced apart from each other, however, this is merely an example. In an alternative embodiment, as shown in FIG. 7, second magnetic units MG2 of a mask assembly manufacturing apparatus may be disposed in contact with each other without being spaced apart from each other. In such an embodiment, although not shown in FIG. 7, similar to the second magnetic units MG2 which are disposed in contact with each other, the first magnetic units MG1 (refer to FIG. 3) may be disposed in contact with each other.

The alignment unit AL may align the support bar SB fixed by the fixing unit FX1 in the Z direction DR-Z. When the support bar SB is disposed on the frame FR, a weight of the support bar SB may cause the center CT of the support bar SB to sag toward the opening FR-OP. The magnetic units MG1 and MG2 included in the alignment unit AL may be disposed above the support bar SB and may pull the support bar SB in the Z direction DR-Z by its magnetic force. The magnetic units MG1 and MG2 may pull the center CT of the support bar SB, which sags toward the opening FR-OP, in the Z direction DR-Z, and thus, the support bar SB disposed on the frame FR may maintain a flat state without being bent.

In an embodiment, in a case where the support bar SB is disposed closer to the first magnetic unit MG1 than the second magnetic unit MG2 in the X direction DR-X or the support bar SB is disposed closer to the second magnetic unit MG2 than the first magnetic unit MG1 in the X direction DR-X when viewed in the plane, the position of the support bar SB may be adjusted. In this case, the position of the support bar SB may be adjusted in the X direction DR-X to a position where the magnetic force applied to the center CT of the support bar SB from the first magnetic unit MG1 becomes equal to the magnetic force applied to the center CT of the support bar SB from the second magnetic unit MG2. Accordingly, the position at which the support bar SB is disposed on the frame FR may be aligned in the X direction.

The alignment unit AL may move in the X direction DR-X along a third guide GD3. The third guide GD3 may be a groove defined in the stage ST. The alignment unit AL may align the support bars SB disposed at different positions from each other while moving in the X direction DR-X along the third guide GD3.

Although not shown in figures, the mask assembly manufacturing apparatus may further include a welding unit (not shown). The welding unit (not shown) may weld the support bar SB aligned by the alignment unit AL to the frame FR. Accordingly, the aligned support bar SB may be fixed to the frame FR.

Hereinafter, an embodiment of the mask assembly manufacturing apparatus will be described with reference to FIG. 8. The same or like elements shown in FIG. 8 have been labeled with the same reference characters as used above to describe the embodiment of the mask assembly manufacturing apparatus shown FIGS. 3 to 7, and any repetitive detailed description thereof will hereinafter be omitted or simplified.

Figure 8:
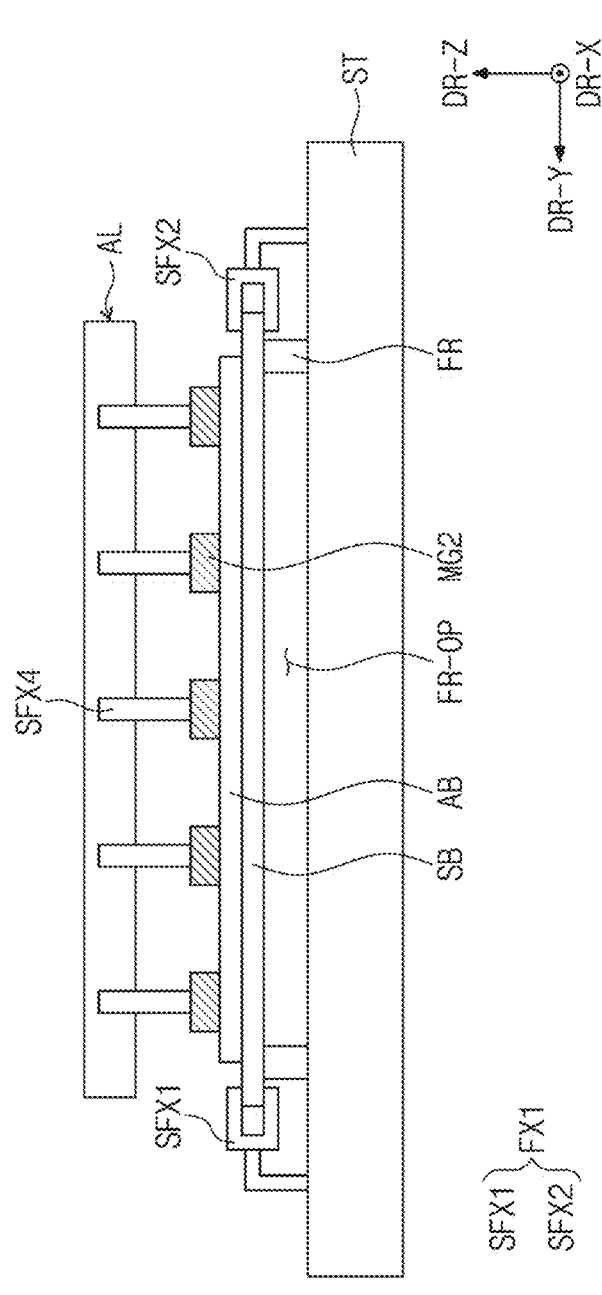
FIG. 8 is a front view of a portion of a mask assembly manufacturing apparatus according to an embodiment of the disclosure.

For convenience of illustration and description, FIG. 8 shows only the second magnetic unit MG2, however, the above-described features of the second magnetic unit MG2 may be applied to the first magnetic unit MG1 shown in FIG. 3.

FIG. 8 is a front view of a portion of the mask assembly manufacturing apparatus according to an embodiment of the disclosure. The mask assembly manufacturing apparatus in FIG. 8 is substantially the same as the mask assembly manufacturing apparatus shown in FIGS. 3 to 7, except for an auxiliary substrate AB disposed between the support bar SB and the magnetic unit MG2.

Referring to FIG. 8, an embodiment of the mask assembly manufacturing apparatus may further include the auxiliary substrate AB between the support bar SB and the second magnetic unit MG2. In such an embodiment, the support bar SB and the second magnetic unit MG2 may be spaced apart from each other in the Z direction DR-Z, and the auxiliary substrate AB may be disposed between the support bar SB and the second magnetic unit MG2. The auxiliary substrate AB may be a glass substrate or an acrylic substrate, however, this is merely an example.

The auxiliary substrate AB may be disposed directly on the support bar SB. The second magnetic unit MG2 may be disposed directly on the auxiliary substrate AB. The auxiliary substrate AB may uniformly maintain a distance between the second magnetic unit MG2 and the support bar SB. As the distance between the second magnetic unit MG2 and the support bar SB is uniformly maintained, the magnetic force of the second magnetic unit MG2, which pulls the support bar SB in the Z direction DR-Z, may be uniformly maintained. Accordingly, the support bar SB may be maintained in a flat shape by the second magnetic unit MG2.

Hereinafter, an embodiment of the mask assembly manufacturing method will be described in detail with reference to FIGS. 9 to 16. The same or like elements shown in FIGS. 9 to 16 have been labeled with the same reference characters as used above to describe the embodiment of the mask assembly manufacturing apparatus shown FIGS. 3 to 8, and any repetitive detailed description thereof will hereinafter be omitted or simplified.

Figure 9:
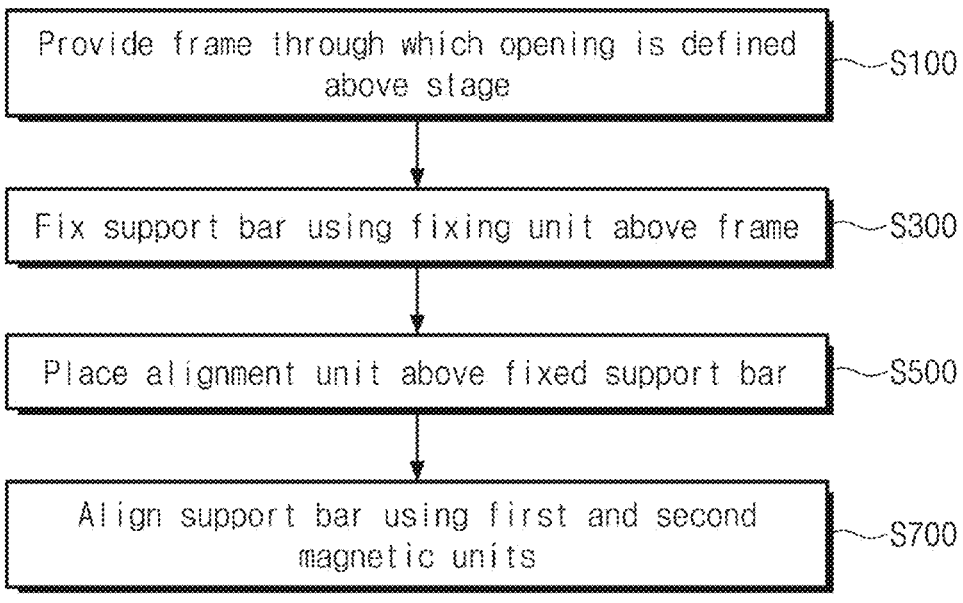
FIG. 9 is a flowchart of a mask assembly manufacturing method according to an embodiment of the disclosure.

FIG. 9 is a flowchart of the mask assembly manufacturing method according to an embodiment of the disclosure. FIGS. 10 to 13B are views of processes of the mask assembly manufacturing method according to an embodiment of the disclosure.

Referring to FIG. 9, an embodiment of the mask assembly manufacturing method may include providing (or preparing) the frame through which the opening is defined on the stage (S100), fixing the support bar to the frame using the fixing unit (S300), placing (or disposing) the alignment unit on the fixed support bar (S500), and aligning support bar using the first magnetic units and the second magnetic units (S700).

FIG. 10 shows the process of providing the frame FR through which the opening FR-OP is defined on the stage ST (S100). The frame FR may be placed on the stage ST. The frame FR may be fixed to the stage ST by vacuum suctioning, however, this is merely an example. The process of fixing the frame FR to the stage ST should not be limited thereto or thereby.

FIG. 11 shows the process of fixing the support bar SB onto the frame FR using the fixing unit FX1 (S300). The fixing of the support bar SB onto the frame FR using the fixing unit FX1 (S300) may include fixing the support bar SB onto the frame FR using the first sub-fixing unit SFX1 and the second sub-fixing unit SFX2. One end of the support bar SB may be fixed by the first sub-fixing unit SFX1 and the other end of the support bar SB may be fixed by the second sub-fixing unit SFX2. In this case, the support bar SB disposed on the frame FR may be bent toward the opening FR-OP due to the support bar SB.

Figure 12:
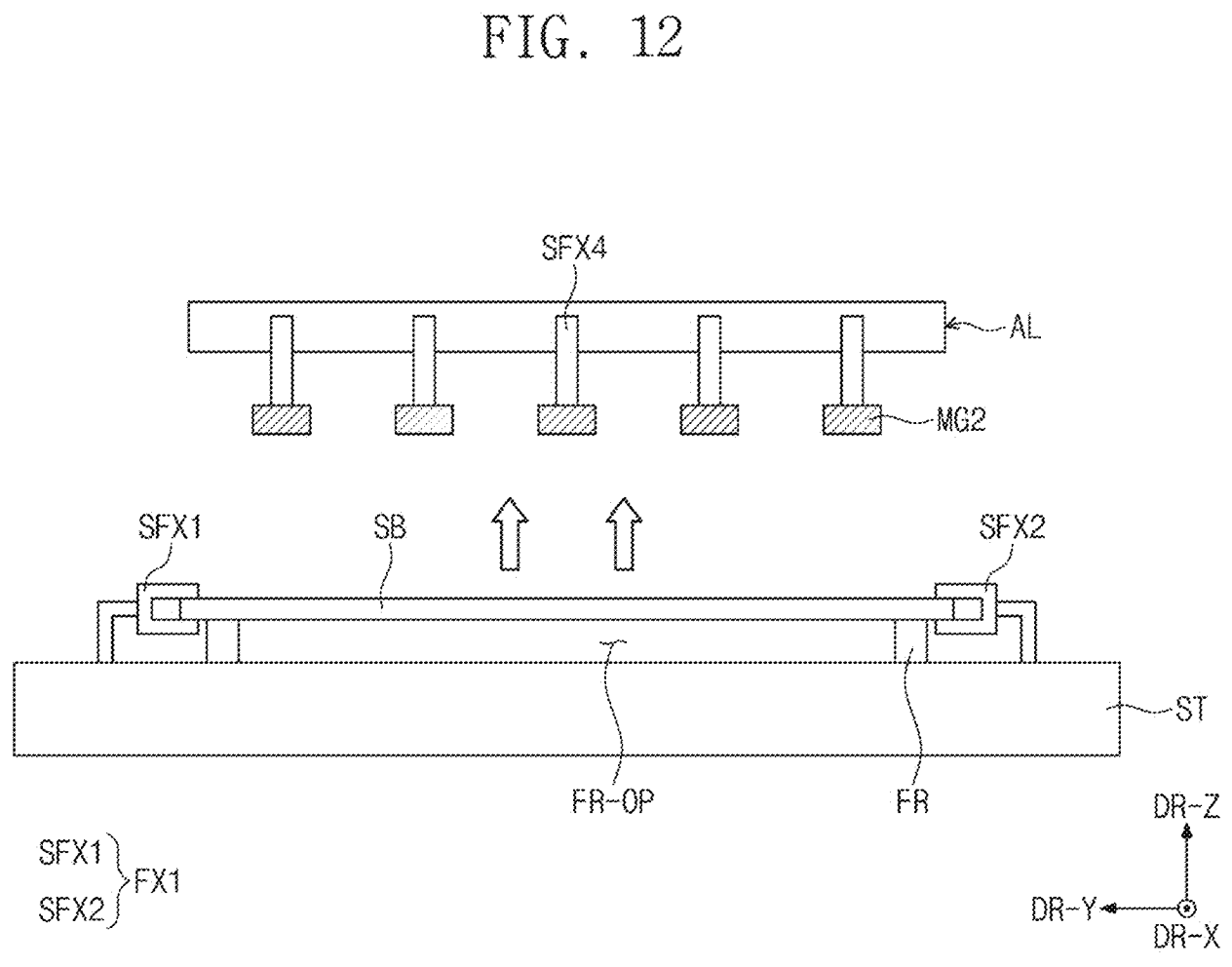

FIG. 12 shows the process of placing the alignment unit AL on the fixed support bar SB (S500). Referring to FIG. 12, the placing of the alignment unit AL on the fixed support bar SB (S500) may include pulling the bent support bar SB in the Z direction DR-Z. Accordingly, the bent support bar SB disposed on the frame FR may be maintained in the flat shape.

FIG. 12 shows an embodiment in which the second magnetic units MG2 are disposed spaced apart from each other in the Y direction DR-Y, however, the disclosure should not be limited thereto or thereby. In an alternative embodiment, for example, as shown in FIG. 7, the second magnetic units MG2 adjacent to each other may be disposed in contact with each other.

Referring to FIGS. 6 and 12, the placing of the alignment unit AL (S500) may include disposing the first magnetic units MG1 to be spaced apart from each other in the first direction DR-Y and disposing the second magnetic units MG2 to be spaced apart from each other in the first direction DR-Y. The placing of the alignment unit AL (S500) may include allowing the separation distance L1-3 in the first direction DR-Y between the first magnetic units MG1 to be the same as the separation distance L2-3 in the first direction DR-Y between the second magnetic units MG2 (or placing the alignment unit AL in a way such that the separation distance L1-3 in the first direction DR-Y between the first magnetic units MG1 becomes the same as the separation distance L2-3 in the first direction DR-Y between the second magnetic units MG2).

In addition, referring to FIGS. 4 and 12, the placing of the alignment unit AL on the support bar SB (S500) may include disposing the first magnetic units MG1 and the second magnetic units MG2 to be spaced apart from the support bar SB above the support bar SB.

Figure 13A:
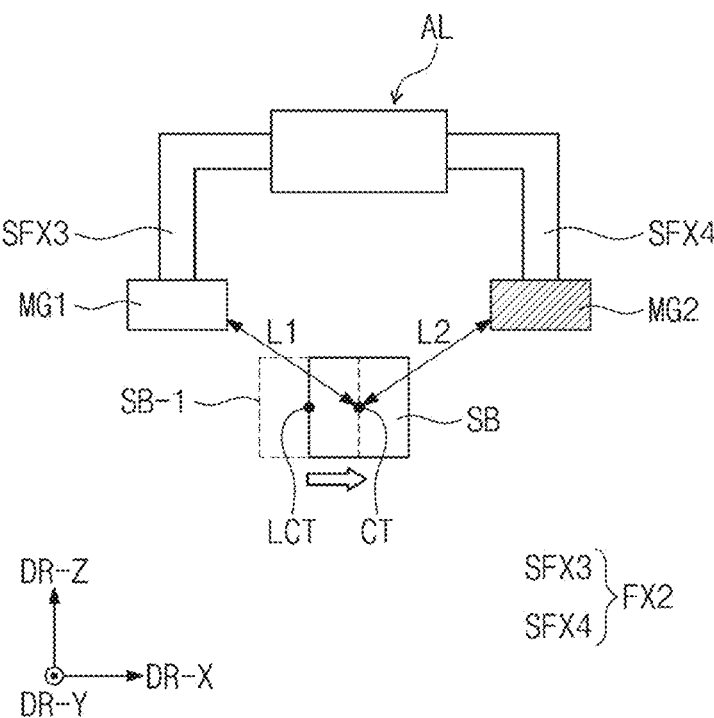
FIG. 13A is a view of a process of a mask assembly manufacturing method according to an embodiment of the disclosure.
Figure 13B:
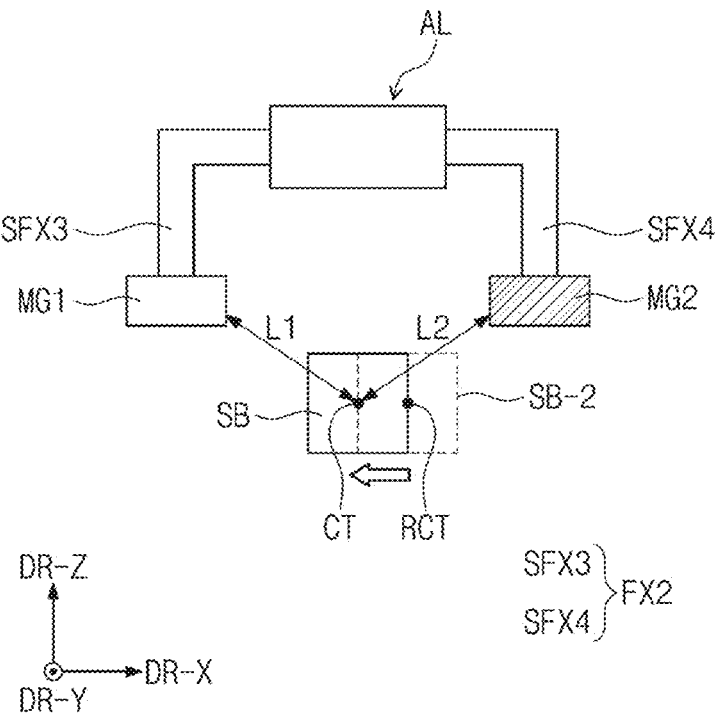
FIG. 13B is a view of a process of a mask assembly manufacturing method according to an embodiment of the disclosure.

FIGS. 13A and 13B schematically show aligning the fixed support bar SB using the first magnetic units MG1 and the second magnetic units MG2 (S700).

Referring to FIG. 13A, the aligning of the support bar SB using the first magnetic units MG1 and the second magnetic units MG2 (S700) may include moving a support bar SB-1, which is disposed at a first position, in a direction toward the second magnetic unit MG2 when a center LCT of the support bar SB-1 disposed at the first position is closer to the first magnetic unit MG1 than the second magnetic unit MG2. Accordingly, the center CT of the support bar SB disposed at a second position may be aligned at a position where the separation distance L1 from the first magnetic unit MG1 is equal to the separation distance L2 from the second magnetic unit MG2.

Referring to FIG. 13B, the aligning of the support bar SB using the first magnetic units MG1 and the second magnetic units MG2 (S700) may include moving a support bar SB-2, which is disposed at a third position, in a direction toward the first magnetic unit MG1 when a center RCT of the support bar SB-2 disposed at the third position is closer to the second magnetic unit MG2 than the first magnetic unit MG1. Accordingly, the center CT of the support bar SB may be aligned at a position where the separation distance L1 from the first magnetic unit MG1 is equal to the separation distance L2 from the second magnetic unit MG2. As described above, as the support bar SB is aligned on the frame FR by the first magnetic units MG1 and the second magnetic units MG2, the mask assembly MSA (refer to FIG. 2) manufactured by the mask assembly manufacturing method may have improved reliability.

Hereinafter, an alternative embodiment of a mask assembly manufacturing method will be described with reference to FIGS. 14 to 16. The mask assembly manufacturing method shown in FIGS. 14 to 16 is substantially the same as the mask assembly manufacturing method described above with reference to FIGS. 8 to 13b except for placing the auxiliary substrate above the support bar.

Figure 14:
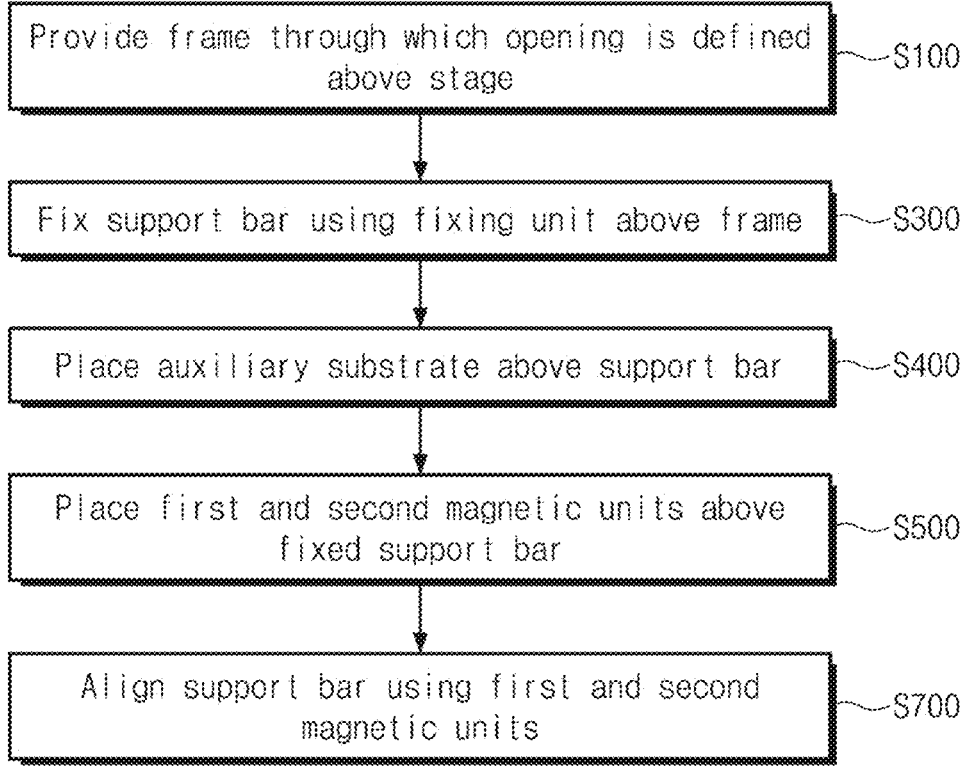
FIG. 14 is a flowchart of a mask assembly manufacturing method according to an embodiment of the disclosure.

FIG. 14 is a flowchart of the mask assembly manufacturing method according to an embodiment of the disclosure. FIGS. 15 and 16 are views of processes of the mask assembly manufacturing method according to an embodiment of the disclosure.

Referring to FIG. 14, an embodiment of the mask assembly manufacturing method may further include placing the auxiliary substrate above the support bar (S400) between the fixing of the support bar on the frame using the fixing unit (S300) and the placing of the alignment unit above the fixed support bar (S500), that is, after the fixing of the support bar on the frame using the fixing unit (S300) and before the placing of the alignment unit above the fixed support bar (S500).

Figure 15:
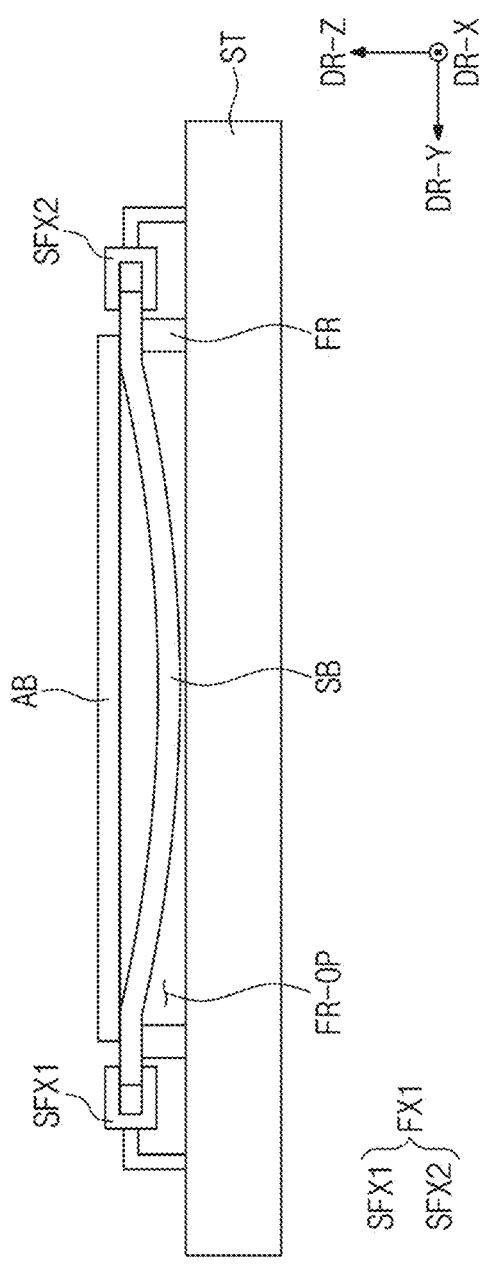
FIG. 15 is a view of a process of a mask assembly manufacturing method according to an embodiment of the disclosure.
Figure 16:
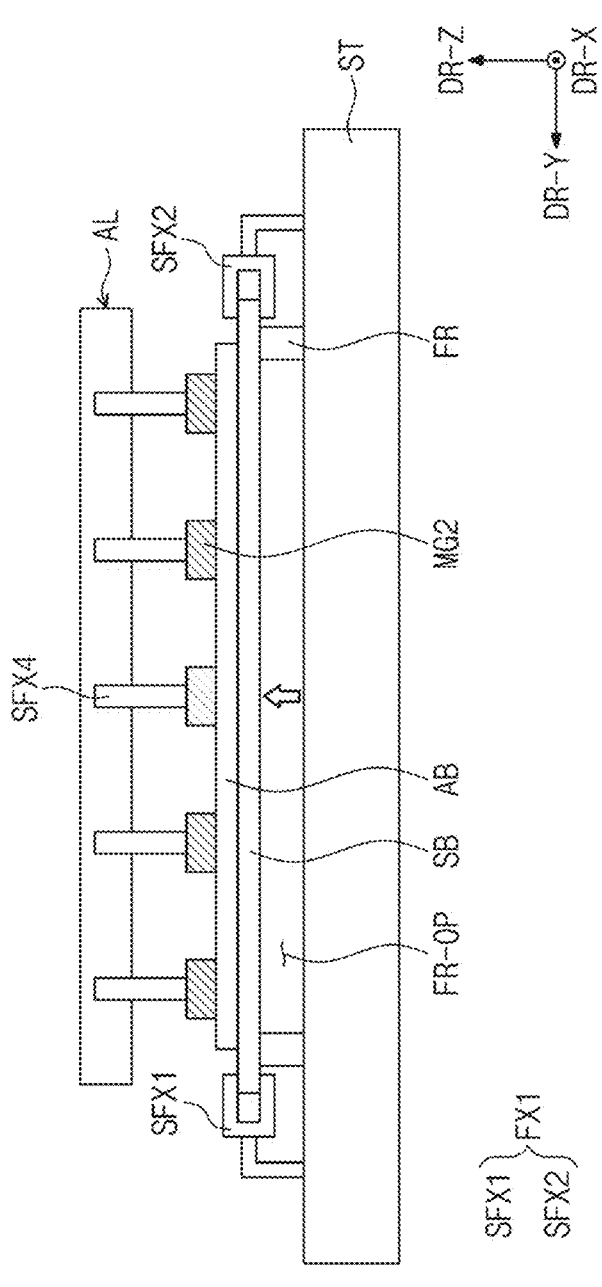
FIG. 16 is a view of a process of a mask assembly manufacturing method according to an embodiment of the disclosure.

FIG. 15 shows the process of placing the auxiliary substrate above the support bar (S400). Referring to FIG. 15, the placing of the auxiliary substrate AB above the support bar SB may include disposing the auxiliary substrate AB directly on the support bar SB.

FIG. 16 shows the process of placing the alignment unit AL on the support bar (S500). Referring to FIG. 16, the placing of the alignment unit AL on the support bar SB may include placing the second magnetic unit MG2 on the auxiliary substrate AB. As the second magnetic unit MG2 is disposed on the auxiliary substrate AB, the second magnetic unit MG2 may be disposed spaced apart from the support bar SB at a uniform distance in the Z direction DR-Z. Accordingly, the second magnetic unit MG2 may align the support bar SB on the frame FR and may maintain the support bar SB in the flat shape. As described above, the support bar SB may be aligned on the frame FR by the second magnetic unit MG2, and thus, the reliability of the manufactured mask assembly MSA (refer to FIG. 2) may be improved.

In such an embodiment, the above-described features of the second magnetic unit MG2 may be applied to the first magnetic unit MG1 (refer to FIG. 3).

Figure 17A:
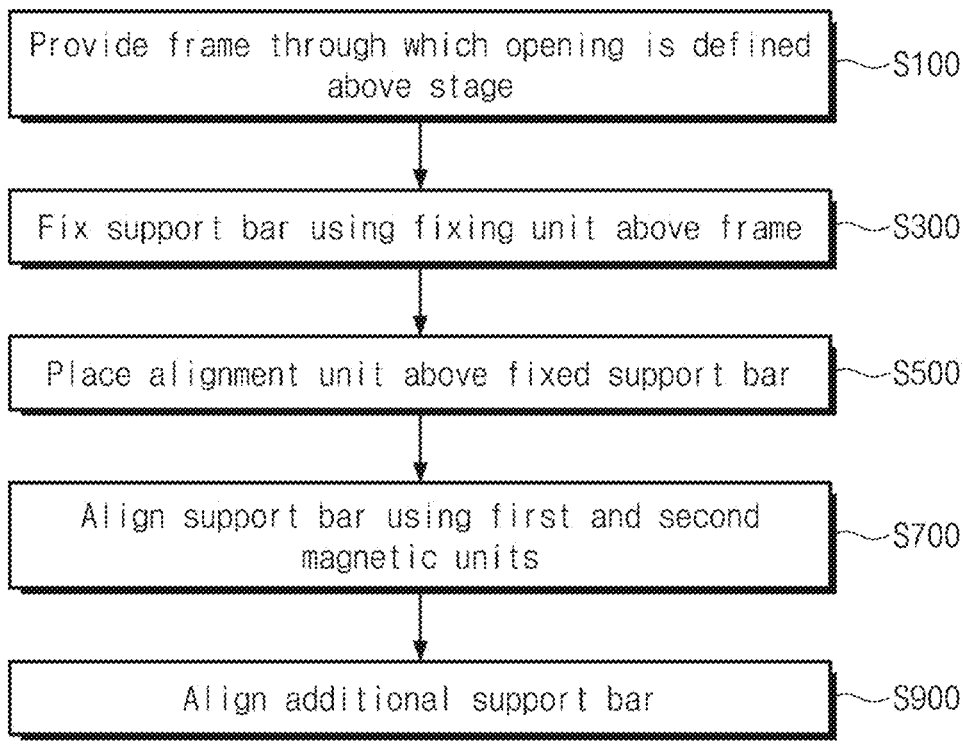
FIG. 17A is a flowchart of a mask assembly manufacturing method according to an embodiment of the disclosure.
Figure 17B:
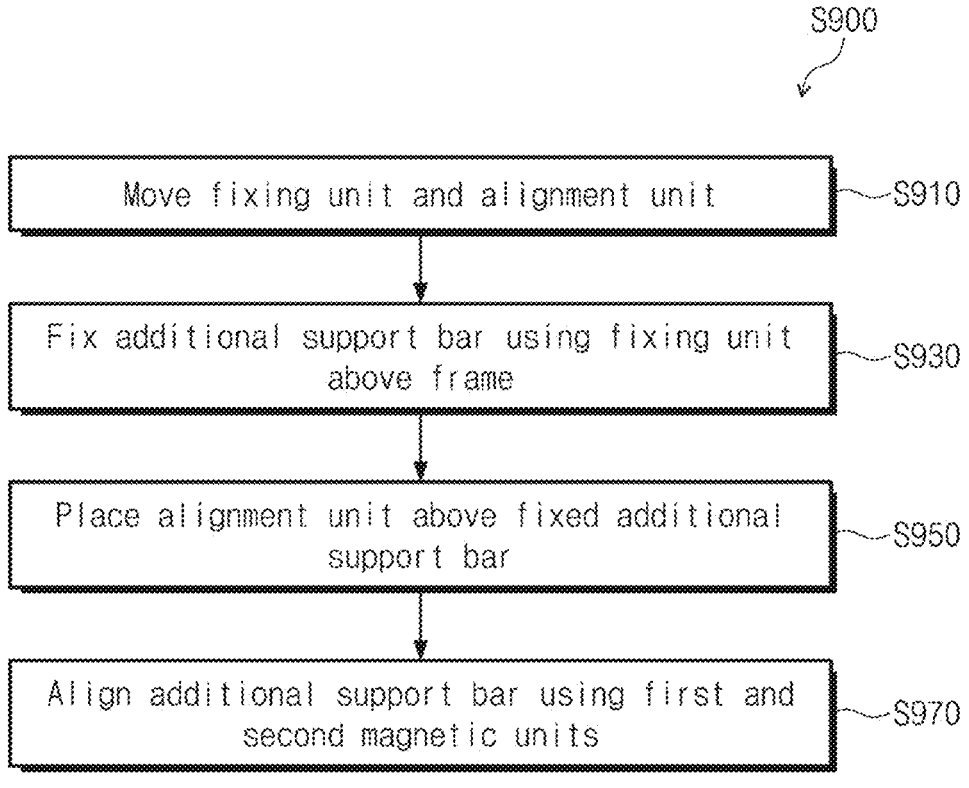
FIG. 17B is a flowchart of a mask assembly manufacturing method according to an embodiment of the disclosure.

FIGS. 17A and 17B are flowcharts showing the mask assembly manufacturing method. The mask assembly manufacturing method shown in FIGS. 17A and 17B is substantially the same as the mask assembly manufacturing method shown in FIGS. 9 to 13B except for aligning an additional support bar (S900).

Referring to FIGS. 3, 17A, and 17B, the mask assembly manufacturing method may further include the aligning of the additional support bar SB (S900) after the aligning of the support bar SB using first magnetic units MG1 and second magnetic units MG2 (S700). The aligning of the additional support bar (S900) may include moving the fixing unit FX1 and the alignment unit AL in the second direction DR-X (S910), fixing the additional support bar SB using the fixing unit FX1 above the frame FR (S930), placing the alignment unit AL above the fixed additional support bar SB (S950), and aligning the additional support bar SB using the first magnetic units MG1 and the second magnetic units MG2 (S970). Accordingly, the mask assembly MSA including the plural support bars SB shown in FIG. 2 may be manufactured by the mask assembly manufacturing method.

In embodiments of the invention, the mask assembly manufacturing apparatus may include magnetic units disposed above the stage on which the frame is disposed. The magnetic units may align a position of the support bar on the frame, and thus, the support bar may be maintained in the flat shape without being bent. The support bars of the mask assembly manufactured by the mask assembly manufacturing apparatus may be accurately arranged, and thus, the mask assembly may have excellent reliability.

In embodiments of the invention, the mask assembly manufacturing method may include the aligning of the support bar using the first magnetic unit and the second magnetic unit and the aligning of the position of the support bar on the frame, and thus, the support bar may be prevented from being bent. The support bars of the mask assembly manufactured by the mask assembly manufacturing method may be accurately arranged, and thus, the mask assembly may have excellent reliability.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A mask assembly manufacturing apparatus for manufacturing a mask assembly comprising:

a frame through which an opening is defined and a support bar disposed above the frame, the mask assembly manufacturing apparatus comprising:

a stage on which the frame is placed;

an alignment unit disposed above the stage, wherein the alignment unit comprises a plurality of magnetic units; and a fixing unit disposed between the stage and the alignment unit, wherein the fixing unit comprises a first sub-fixing unit which fixes one end of the support bar and a second sub-fixing unit which fixes another end of the support bar and spaced apart from the first sub-fixing unit in a first direction;

wherein the plurality of magnetic units comprises:

a plurality of first magnetic units disposed above the support bar; and a plurality of second magnetic units disposed above the support bar, spaced apart from the first magnetic units in a second direction perpendicular to the first direction, wherein each of the second magnetic units is arranged such that a magnetic pole thereof faces an opposite magnetic pole of a corresponding first magnetic unit; where the plurality of first magnetic units and second magnetic units are each operative to exert a magnetic force on the support bar to prevent it from sagging.

2. The mask assembly manufacturing apparatus of claim 1, wherein each of the first magnetic units and the second magnetic units are disposed spaced apart from the support bar.

3. The mask assembly manufacturing apparatus of claim 2, further comprising:

an auxiliary substrate disposed between the alignment unit and the support bar.

4. The mask assembly manufacturing apparatus of claim 3, wherein the auxiliary substrate is disposed directly on the support bar, and the magnetic units are disposed directly on the auxiliary substrate.

5. The mask assembly manufacturing apparatus of claim 3, wherein the auxiliary substrate is a glass substrate or an acrylic substrate.

6. The mask assembly manufacturing apparatus of claim 1, wherein the first magnetic units are spaced apart from each other at a first distance in the first direction, the second magnetic units are spaced apart from each other at a second distance in the first direction, and the first distance between the first magnetic units is equal to the second distance between the second magnetic units.

7. The mask assembly manufacturing apparatus of claim 1, wherein a separation distance between a center of the support bar and each of the first magnetic units is equal to a separation distance between the center of the support bar and each of the second magnetic units disposed to respectively correspond to the first magnetic units.

8. The mask assembly manufacturing apparatus of claim 1, wherein the first magnetic units adjacent to each other are disposed in contact with each other, and the second magnetic units adjacent to each other are disposed in contact with each other.

9. The mask assembly manufacturing apparatus of claim 1, wherein the support bar comprises stainless steel or a nickel-iron alloy.

10. The mask assembly manufacturing apparatus of claim 1, wherein the alignment unit moves a center of the support bar in a direction toward the second magnetic units when the center of the support bar is closer to the first magnetic units than the second magnetic units, and the alignment unit moves the center of the support bar in a direction toward the first magnetic units when the center of the support bar is closer to the second magnetic units than the first magnetic units.

* * * * *